United States Patent [19]

Becker

[11] Patent Number: 5,208,214
[45] Date of Patent: May 4, 1993

[54] MULTIPHASE SUPERCONDUCTOR AND PROCESS FOR ITS PRODUCTION

[75] Inventor: Winfried Becker, Kelkheim, Fed. Rep. of Germany

[73] Assignee: Hoechst Aktiengesellschaft, Frankfurt am Main, Fed. Rep. of Germany

[21] Appl. No.: 720,495

[22] PCT Filed: Dec. 23, 1989

[86] PCT No.: PCT/EP89/01605
§ 371 Date: Aug. 19, 1991
§ 102(e) Date: Aug. 19, 1991

[87] PCT Pub. No.: WO90/07475
PCT Pub. Date: Jul. 12, 1990

[30] Foreign Application Priority Data
Dec. 29, 1988 [DE] Fed. Rep. of Germany ....... 3844207

[51] Int. Cl.$^5$ ...................... H01L 39/24; C04B 35/00
[52] U.S. Cl. ........................ 501/1; 505/782; 505/785; 501/126; 252/518
[58] Field of Search ............... 505/1, 782, 785; 501/126; 252/518

[56] References Cited
FOREIGN PATENT DOCUMENTS

| 284061 | 9/1988 | European Pat. Off. |
| 284062 | 9/1988 | European Pat. Off. |
| 182548 | 5/1990 | Japan .................... 505/782 |
| 182555 | 5/1990 | Japan .................... 505/782 |
| 2232664 | 12/1990 | United Kingdom ........ 505/782 |

OTHER PUBLICATIONS

Japanese Journal of Applied Physics, Maeda et al., pp. L209–L210. Feb. 1988.
Nicolas et al, "Effect of Indium Subtitution in the 80K and 110K Superconductor of the Bi—Si—Ca—Cu—O System", Supercond. Sci. Technology 2(6) pp. 304–307, Dec. 1989.

Primary Examiner—Mark L. Bell
Assistant Examiner—C. M. Bonner
Attorney, Agent, or Firm—Curtis, Morris & Safford

[57] ABSTRACT

An oxide ceramic superconductor can be obtained if the oxides of bismuth, strontium, calcium and copper are mixed, the atomic ratios of the metals corresponding to a high-temperature superconductor, the mixture is mixed with an alkaline earth metal indate powder of the formula $(Sr,Ca)In_2O_4$ and the mixture is heated for a prolonged period in the presence of oxygen. The presence of the indate promotes the development of a phase having a critical temperature of 110K.

6 Claims, 3 Drawing Sheets

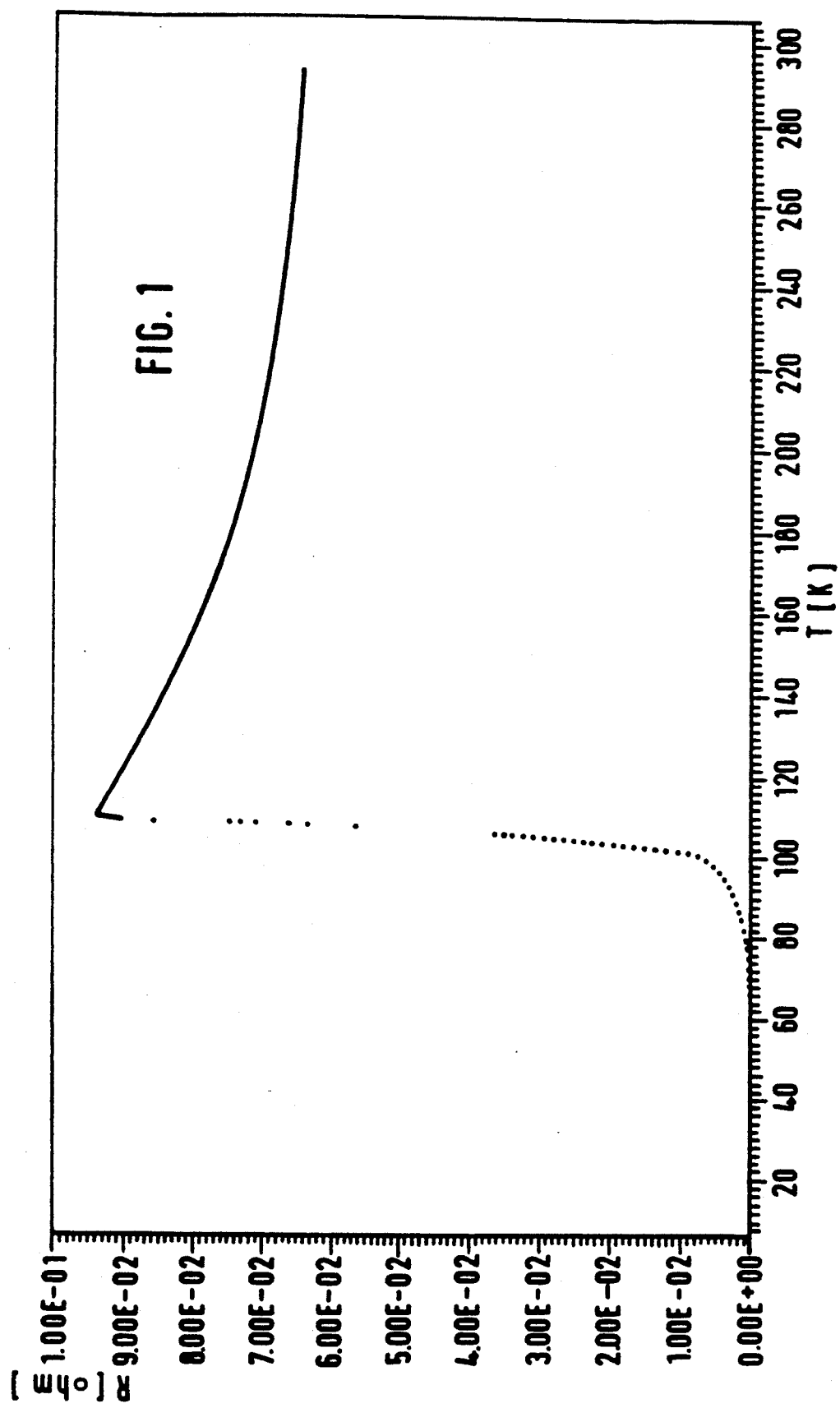

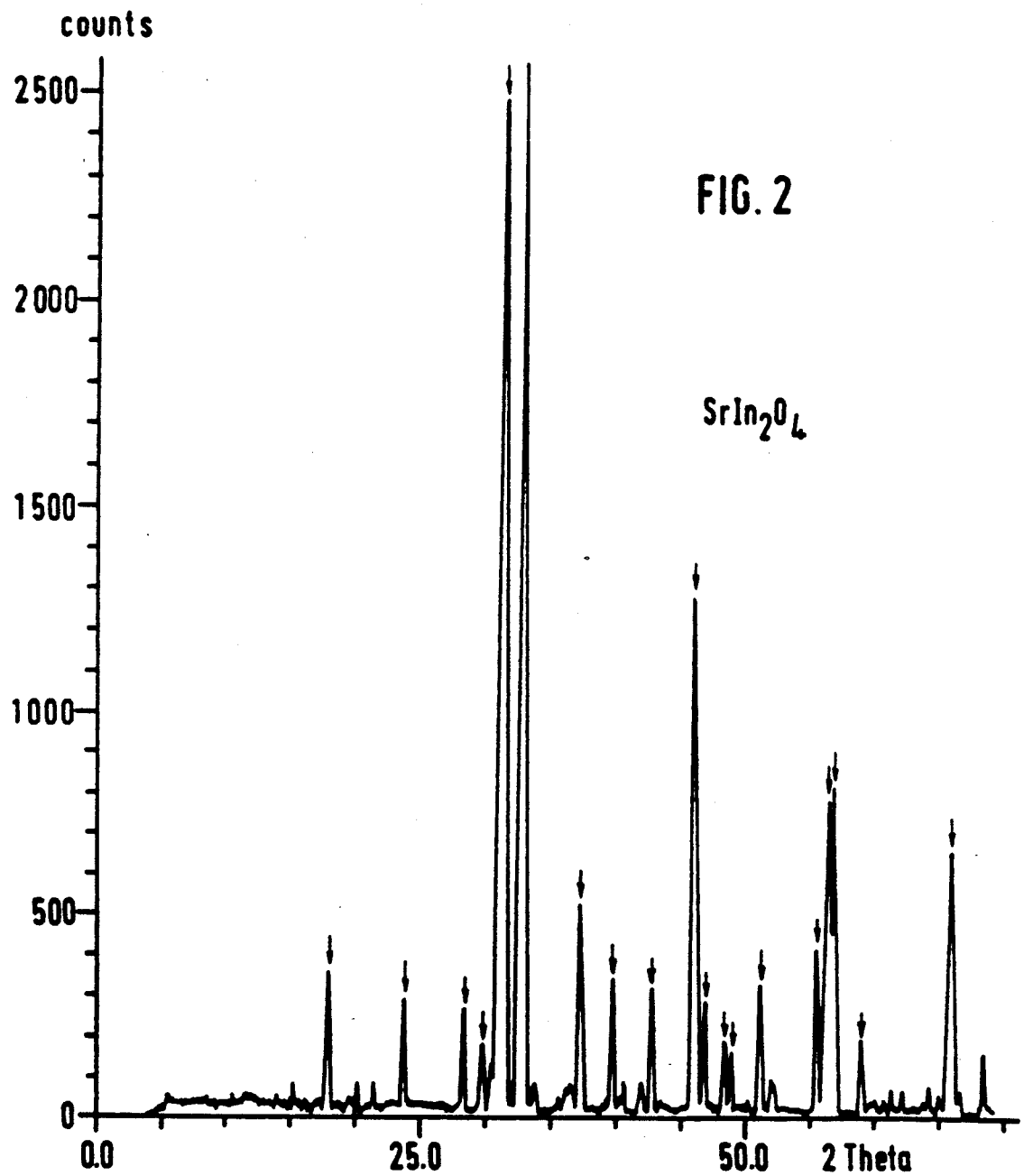

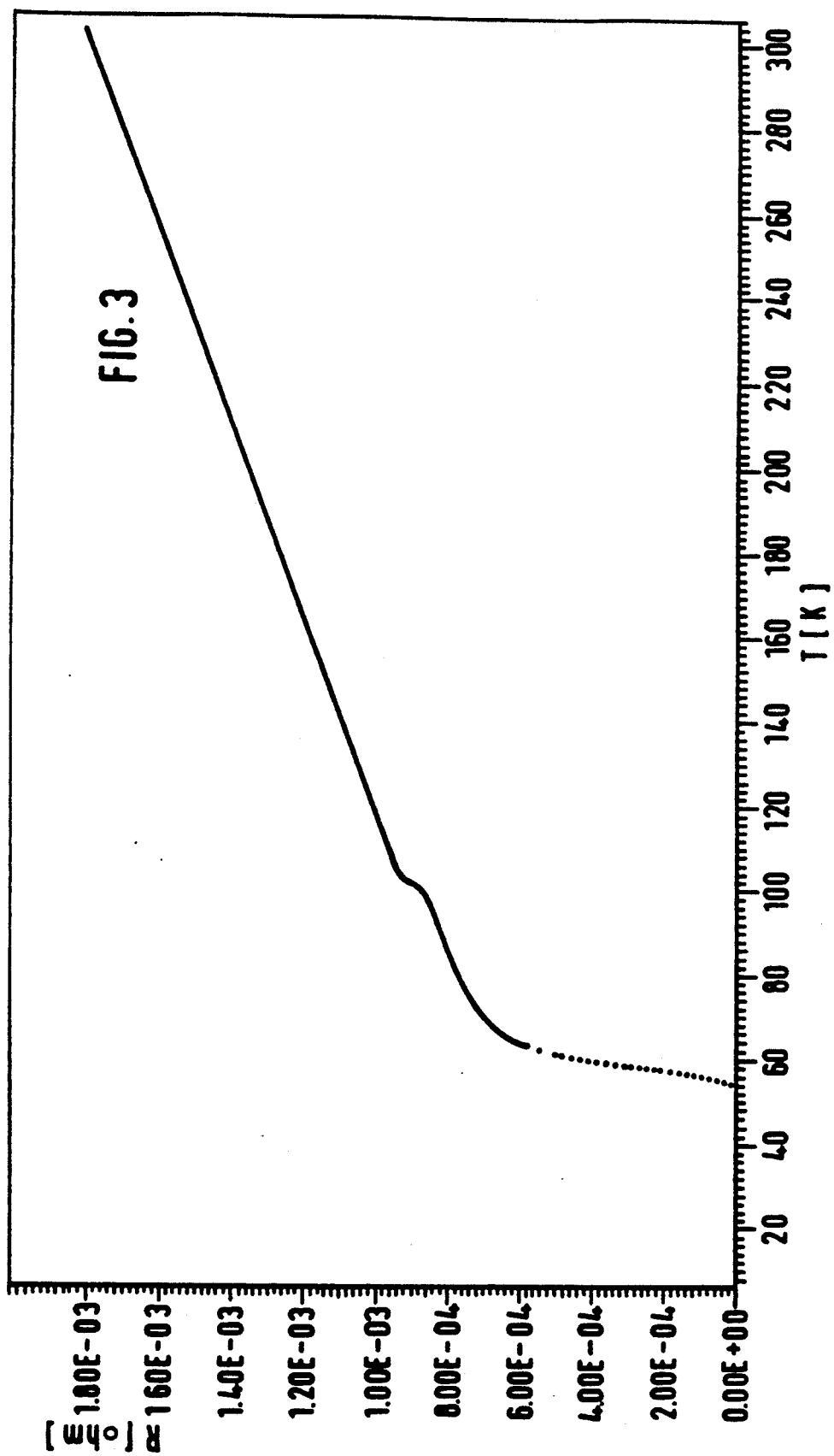

MULTIPHASE SUPERCONDUCTOR AND PROCESS FOR ITS PRODUCTION

The present invention relates to a multiphase ceramic superconductor which contains the nonsuperconducting phase strontium indate and at least one superconducting phase composed of the elements bismuth, strontium, calcium, copper and oxygen, and also a process for its production.

The compound strontium indate, $SrIn_2O_4$, has been known for a fairly long time (Z. Naturforschung 19b (1967) 955).

It is known that ceramic superconductors which are based on the elements bismuth, strontium, calcium, copper and oxygen generally contain only small proportions of a phase which is superconducting at 110K.

The object was therefore to find a process for increasing the proportion of the phase which is superconducting at 110K in the superconductor. The present invention solves this problem.

The invention is based on the discovery that the proportion of the phase which is superconducting at 110K and which is composed of the elements bismuth, strontium, calcium, copper and oxygen is increased if the phase formation takes place in the presence of strontium indate.

A process has now been found for producing a superconductor which contains at least one superconducting phase based on the elements bismuth, strontium, calcium, copper and oxygen, in which process a mixture of the oxides of bismuth, strontium, calcium and copper or corresponding oxide precursors is mixed and, at the same time, an atomic ratio of the elements is maintained which corresponds to an overall composition $Bi_4(Sr,Ca)_kCu_{k-2}O_x$, where k is a number from 4 to 8 and the Sr/Ca atomic ratio is 1:9 to 9:1, and the mixture is heated for a prolonged period in the presence of oxygen. The process is characterized in that generally 0.428 to 9 times the amount of strontium indate powder is added to the mixture before heating. Preferably, three times the amount of indate is mixed in.

Instead of strontium indate, the mixed-crystal compound strontium/calcium indate having all the Sr/Ca atomic ratios, for example even pure calcium indate, $CaIn_2O_4$, may be used. The indates mentioned are inert under the conditions of synthesis of the superconductor. The proportion of indate added is therefore found again in the ceramic superconductor obtained.

The $(Ca,Sr)In_2O_4$ may also be prepared in situ from the alkaline earth metal oxides and indium oxides or indium carbonate, for example in accordance with the equation

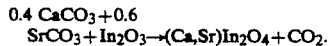

$$0.4\ CaCO_3 + 0.6\ SrCO_3 + In_2O_3 \rightarrow (Ca,Sr)In_2O_4 + CO_2.$$

In this case, the mixture for producing the superconductor should contain an excess of alkaline earth metal oxide which is equimolar with the amount of indium oxide. It is important that indate added is in finely powdered form and is thoroughly mixed with the indium-free mixture.

By the specified process it is possible to prepare superconductors which contain, in addition to strontium indate, at least one of the superconducting phases $Bi_4(Sr,Ca)_4Cu_2O_x$ or $Bi_4(Ca,Sr)_6Cu_4O_x$ or $Bi_4(Ca,Sr)_8Cu_6O_x$, the Ca/Sr atomic ratio being 1:9 to 9:1 in each case.

The novel superconductors can be produced by thoroughly mixing oxides or oxide precursors of the elements Bi, Sr, Ca and Cu together with $SrIn_2O_4$ and heating the mixture to temperatures of at least 700° C.

During the reaction, the atomic ratio of the metals used does not change to a first approximation. The atomic ratio used therefore corresponds to the desired oxide composition.

As oxide precursors, it is generally possible to use compounds which react to form the corresponding oxides at the reaction temperature, in particular the hydroxides and nitrates. The acetates, formates, oxalates and also carbonates of the metals mentioned may furthermore be used. For example, calcium oxide, strontium carbonate, bismuthic acid, bismuth(III) oxide, bismuth(V) oxide $Cu_2O$ and CuO may be used.

The reaction mixture does not need to melt or needs to melt only partially. In this case, however, it is necessary to maintain the reaction temperature for prolonged period.

In the latter case, the synthesis temperature is preferably between 700° and 900° C., preferably 750° to 800° C.

The reaction time should be at least 4 hours, still better at least 8 hours. The reaction time is limited in the upward direction only by economic considerations. Reaction times of 100 or 120 hours are possible.

The mixture may also be heated to such a high temperature that it is completely molten. In this case, cooling can be carried out rapidly to temperatures of 300°-900° C. and the temperature can be kept for a prolonged period (at least one hour, preferably 4 hours) in this range.

Preferably, the melt can be applied to a substrate and allowed to solidify thereon. After the subsequent tempering treatment, compact layers of the superconductor are thus obtained on a base. The substrate (base) should not react with the reaction mixture. For example, $Al_2O_3$, $SiO_2$ (quartz), $ZrO_2$, $SrIn_2O_4$, strontium titanate and barium titanate, and also metals such as steel and Cr/Ni alloys are suitable.

The melt may also be spun. This produces wires which are likewise superconducting after tempering.

The actual reaction should take place in a nonreducing atmosphere. For example, air, pure oxygen, mixtures of $O_2/Ar$ or $O_2/N_2$ may be used. It is preferable if the reaction of the oxides is carried out in an oxygen-containing atmosphere.

After completion of the reaction, the specimen is either removed from the furnace and cooled in air or oxygen or slowly cooled in the furnace to room temperature. Low cooling rates have a beneficial effect on the superconducting properties of the reaction product.

To ensure that the entire oxide mixture has reacted, it is advantageous to comminute further the powder obtained after cooling and to treat it thermally again. During this after-treatment, the temperature is in the range from 300° to 900° C.

Preferred lower limits of the after-treatment temperature are at least 300° C., in particular 400° C., and a preferred upper limit is 750° C., better 600° C., in particular 550° C. The possible after-reaction should be carried out in air, pure oxygen, or a gas mixture such as $O_2/Ar$ or $O_2/N_2$. Commercially available crucibles or boats made of inert materials such as, for example, aluminum oxide, zirconium, platinum and iridium or $SrIn_2O_4$ may be used as reaction vessels. Suitable heat sources are commercially available furnaces such as, for example, chamber, muffle or tubular furnaces.

A further process for producing the superconducting substances is to mix salts of the metals mentioned in the presence of an aqueous phase, evaporate the water-containing salt mixture and heat at temperatures of at least 700° C. At least one of the salts used should be water-soluble and the salts should decompose to form the oxides in the specified temperature range. The same remarks apply with respect to the reaction time as when the oxides are used.

The salt mixture to be evaporated down can also be produced by dissolving the metal oxides in nitric acid and fuming off the nitric acid.

Provided water-soluble salts are used, the metal hydroxides may also be precipitated by adding a base, for example tetramethylammonium hydroxide. In this way it is possible to achieve a particularly thorough mixing of the starting products. The precipitated hydroxides may be separated off, dried and then tempered as specified above. Preferably, no low-volatility cations are entrained by the base used and no low-volatility anions by the salts used.

In this refinement of the process according to the invention, the atomic ratio of the metal salts used also corresponds to the desired atomic ratio of the final product. The oxidic products produced from the salts may likewise be thermally after-treated as described above.

In general, the mixture contains black crystals of the phase $Bi_4(Sr,Ca)_k Cu_{k-2} O_x$, crystals having $k=4$ ($T_c=60K$), $k=5$ ($T_c=85K$) and $k=6$ ($T_c=110K$) being simultaneously present alongside one another.

Surprisingly, superconducting substances can be prepared in the process according to the invention from laboratory chemicals having a purity of only about 99.5%.

The superconducting substances prepared can be used in power engineering (for cables and wires, transformers and energy stores in the form of coils with current flowing through them) in magnetic technology (for example for nuclear spin tomographs and for producing holding magnets for suspension railways) in computer engineering (thin films, connections on conductor boards, Josephson switching devices) and for electronic components (detectors, aerials, transistors, electronic sensors, for example SQUIDs, galvanometers, modulators, bolometers and SLUGs). The use of superconduction in metrology is dealt with in a treatise of the same name by Prof. F. Baumann, Karlsruhe in a series of treatises in the VDI training manual (1976).

In the foregoing, the value of x is derived from the known valences of the elements in general formula $Bi_4(Sr, Ca)_k Cu_{k-2} O_x$, i.e., each Bi atom in the formula is associated with three oxygen atoms, the remaining atoms are each associated with two oxygen atoms, and oxygen exists naturally as $O_2$. Thus:

$$x = \frac{(4 \cdot 3) + (k \cdot 2) + 2(k - 2)}{2}$$

As the skilled artisan can further appreciate an derive from the foregoing description, the oxygen content may increase slightly due to small amounts of $Bi^{5+}$ and $Cu^{3+}$ which can arise from the temperatures used during manufacture. Thus, x is about $4+2k$; and, x can equal $4+2k+\delta$ wherein $\delta$ is about zero to about 0.4 from respectively high manufacturing temperatures, e.g., 700° C. and greater, to low manufacturing temperatures, e.g., 400° C. and less.

The invention is explained in more detail by the examples.

EXAMPLE 3.1250 g of $In_2O_3$, 1.7508 g of $Bi_2O_3$, 0.8763 g of CaO, 4.4736 g of $SrCO_3$ and 2.4106 g of CuO are weighed out and intimately mixed in an agate mortar. The mixture is then pre-reacted in a corundum crucible for 6 hours at 800° C. The temperature is then increased to 1000° C. and kept at 1000° C. for 6 h. Cooling is then carried out to 300° C. in 4 hours and the sample having the overall composition $Bi_{0.5}In_{1.5}Sr_2CaCu_2O_x$ is removed. The sample is again homogenized in an agate mortar and then compressed into tablets (diameter: 1 cm, thickness: approximately 2 mm). These are then sintered for 30 hours at 1000° C. on an $Al_2O_3$ base and removed from the furnace after cooling to 100° C. (3 hours). A specimen prepared in this way has a critical temperature of 102K (FIG. 1). $SrIn_2O_4$ and Bi-containing superconducting phases are essentially found in the X-ray diagram. The X-ray diagram of $SrIn_2O_4$ is shown in FIG. 2.

The comparison of FIG. 1 with FIG. 3 (production of a superconductor of the overall composition $Bi_4Sr_3Ca_3Cu_6O_{18+a}$ without indium added) shows that the presence of $SrIn_2O_4$ in the reaction mixture beneficially affects the formation of the 110K phase.

BRIEF DESCRIPTION OF THE DRAWINGS

FIGS. 1 and 3 each show the dependence of the resistance R (ohm) on the absolute temperature T (K). The x-ray diagram of $SrIn_2O_4$ is shown in FIG. 2.

I claim:

1. A multiphase ceramic superconductor which contains
   a) an oxide ceramic superconductor of the overall composition $Bi_4(Sr,Ca)_kCu_{k-2}O_x$, where k is a number from 4–8, the Sr/Ca atomic ratio is 1:9 to 9:1, and, $x=4+2k+\delta$ where $\delta$ is between about 0 and 0.4; and
   b) the superconducting phase strontium calcium indate $(Sr,Ca)In_2O_4$ having Sr/Ca atomic ratio of 1:0 to 0:1
with an a:b weight ratio of 1:0.428 to 1:9.

2. A superconductor according to claim 1, characterized in that it contains the phase $Bi_4(Sr,Ca)_4Cu_2O_x$, where the strontium/calcium atomic ratio is 1:9 to 9:1.

3. A superconductor according to claim 1, characterized in that it contains the phase $Bi_4(Ca,Sr)_6Cu_4O_x$, where the calcium/strontium atomic ratio is 1:9 to 9:1.

4. A superconductor according to claim 1, characterized in that it contains the superconducting phase $Bi_4(Ca,Sr)_8Cu_6O_x$, where the Ca/Sr atomic ratio is 1:9 to 9:1.

5. A process for producing a superconductor containing at least one superconducting phase which is based on the elements bismuth, strontium, calcium, copper and oxygen, which process comprises mixing the oxide of bismuth, strontium, calcium and copper or corresponding oxide precursors and, at the same time, maintaining an atomic ratio of the elements which corresponds to an overall composition $Bi_4(Sr,Ca)_kCu_{k-2}O_x$, in which k is a number from 4 to 8, the Sr/Ca atomic ratio is 1:9 to 9:1 $x=4+2k+\delta$, and $\delta=0$ to 0.4; and adding 0.428 to 9 times the amount of strontium calcium indate power having an Sr/Ca atomic ratio of 1:0 to 0:1 to the mixture and thoroughly mixing it therewith, and heating the mixture at a reaction temperature in a non-reducing atmosphere for at least 4 hours.

6. The process according to claim 5, characterized in that the strontium calcium indate is prepared in situ from strontium oxide, calcium oxide or their oxide precursors and indium (3) oxide.

* * * * *